United States Patent
Cai

(10) Patent No.: US 10,347,658 B2
(45) Date of Patent: Jul. 9, 2019

(54) PIXEL DRIVING CIRCUIT AND OLED DISPLAY DEVICE THAT EFFECTIVELY COMPENSATE FOR THRESHOLD VOLTAGE IMPOSED ON A DRIVING TFT

(71) Applicant: Shenzhen China Star Optoelectronics Technology Co., Ltd., Shenzhen, Guangdong (CN)

(72) Inventor: Yuying Cai, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 52 days.

(21) Appl. No.: 15/533,445

(22) PCT Filed: Apr. 20, 2017

(86) PCT No.: PCT/CN2017/081248
§ 371 (c)(1),
(2) Date: Jun. 6, 2017

(87) PCT Pub. No.: WO2018/166037
PCT Pub. Date: Sep. 20, 2018

(65) Prior Publication Data
US 2018/0269232 A1    Sep. 20, 2018

(51) Int. Cl.
| | |
|---|---|
| *H01L 27/12* | (2006.01) |
| *H01L 27/32* | (2006.01) |
| *H01L 51/52* | (2006.01) |
| *G09G 3/3225* | (2016.01) |
| *G09G 3/3233* | (2016.01) |

(52) U.S. Cl.
CPC ....... *H01L 27/1214* (2013.01); *G09G 3/3225* (2013.01); *G09G 3/3233* (2013.01); *H01L 27/3244* (2013.01); *H01L 51/5206* (2013.01); *H01L 51/5221* (2013.01); *G09G 2300/0819* (2013.01); *G09G 2300/0861* (2013.01); *G09G 2310/0251* (2013.01);
(Continued)

(58) Field of Classification Search
CPC .. G09G 3/3225; G09G 3/3233; G09G 3/3258; H01L 27/1214; H01L 27/124; H01L 27/1244
See application file for complete search history.

(56) References Cited

U.S. PATENT DOCUMENTS

| | | |
|---|---|---|
| 2008/0074362 A1 | 3/2008 | Ogura |
| 2008/0074413 A1 | 3/2008 | Ogura |

(Continued)

FOREIGN PATENT DOCUMENTS

CN    106205495 A    12/2016

*Primary Examiner* — Ermias T Woldegeorgis
(74) *Attorney, Agent, or Firm* — Andrew C. Cheng

(57) ABSTRACT

A pixel driving circuit and an OLED display are provided. The pixel driving circuit includes a first TFT, a second TFT, a third TFT, a fourth TFT, a capacitor, and an OLED. A gate of the third TFT is coupled to the scanning signal. A source of the third TFT is coupled to a drain of the fourth TFT. A gate of the fourth TFT is coupled to a data signal and a source of the fourth is coupled to a second reference voltage signal. The fourth TFT controls the electric current of the first TFT with the data signal and the second reference signal during the compensation stage of threshold voltage. Further, the compensation voltage of the first TFT is compensated.

11 Claims, 7 Drawing Sheets

(52) U.S. Cl.
CPC ............... *G09G 2310/0262* (2013.01); *G09G 2310/0264* (2013.01); *G09G 2320/043* (2013.01)

(56) References Cited

U.S. PATENT DOCUMENTS

| | | |
|---|---|---|
| 2008/0238953 A1 | 10/2008 | Ogura |
| 2011/0096061 A1 | 4/2011 | Lin et al. |
| 2016/0064481 A1* | 3/2016 | Grill ................. H01L 21/02488 257/506 |
| 2016/0071458 A1* | 3/2016 | Tan ..................... G09G 3/3233 345/212 |
| 2017/0039941 A1 | 2/2017 | Wu et al. |
| 2017/0256202 A1 | 9/2017 | Sun |

* cited by examiner

PIXEL DRIVING CIRCUIT AND OLED DISPLAY DEVICE THAT EFFECTIVELY COMPENSATE FOR THRESHOLD VOLTAGE IMPOSED ON A DRIVING TFT

BACKGROUND

1. Field of the Disclosure

The present disclosure relates to the field of liquid crystal display, and more particularly, to a pixel driving circuit and an organic light-emitting diode (OLED) display device.

2. Description of Related Art

An OLED display device of related art is recognized by the industry to have an extremely developmental potential because the OLED display device has advantages of compactness, simple structure, self-illumination, high brightness, wide viewing angle, short response time, etc.

The OLED device is an electric current driven device. The electric current flows through the OLED to make the OLED give out light. The brightness of the OLED is determined by the electric current. Most integrated circuits (ICs) of related art merely transmits voltage signals so the pixel driving circuit of the OLED needs to transforming a voltage signal into an electric current signal. The pixel driving circuit of related art is a 2T1C pixel with the structure of two TFTs and one capacitor. With the structure, the pixel driving circuit can transform the voltage into the electric current. However, the pixel driving circuit of related art does not have the function of compensation.

FIG. 1 is a circuit diagram of a 2T1C pixel driving circuit of related art. The 2T1C pixel driving circuit includes a first thin-film transistor (TFT) T10, a second TFT T20, and a capacitor Cs. The first TFT T10 is a driving TFT. The second TFT T20 is a switch TFT. The capacitor Cs is a storage capacitor. Specifically, agate of the second TFT T20 is electrically connected to a scanning signal Vsel. A source of the second TFT T20 is electrically connected to a data signal Vdata. A drain of the second TFT T20 is electrically connected to agate of the first TFT T10. A drain of the first TFT T10 is electrically connected to a power signal Vdd. A source of the first TFT T10 is electrically connected to an anode node level of the OLED D. A cathode of the OLED D is electrically connected to a ground terminal. One terminal of the capacitor Cs is electrically connected to a drain of the second TFT T20. The other terminal of the capacitor Cs is electrically connected to the source of the first TFT T10.

Please refer to FIG. 2 as well. FIG. 2 illustrates a timing diagram of a 2T1C pixel driving circuit as illustrated in FIG. 1. The working process of the 2T1C pixel driving circuit is divided into a first working stage S10 and a second working stage S20. At the first working stage S10, the data signal Vdata is a display data signal VDATA, and the scanning signal Vsel is at high voltage level. At the first working stage S20, the data signal Vdata is at low voltage level, and the scanning signal Vsel is at low voltage level as well. At the first working stage S10 and the second working stage S20, the power signal Vdd is constant high voltage.

In the present embodiment, the OLED D gives out light at the second working stage S20. Meanwhile, a gate-source voltage $V_{gs}$ imposed on the first TFT T10, which drives the OLED D to light, satisfies the following equation:

$$V_{gs} = VDATA - V_{OLED};$$

where VDATA indicates the data signal at high voltage level, and $V_{OLED}$ indicates voltage level of an anode node of the OLED D.

As the equation tells, the gate-source voltage $V_{gs}$ for driving illumination of the OLED D is irrelevant to the threshold voltage imposed on the first TFT T10. Therefore, the 2T1C pixel driving circuit fails to compensate the threshold voltage imposed on the driving TFT, i.e., the first TFT T10.

SUMMARY

An object of the present disclosure is to propose a pixel driving circuit and an organic light-emitting diode (OLED) display device to effectively compensate for threshold voltage imposed on a driving TFT because of change.

According to a first aspect of the present disclosure, a pixel driving circuit includes a first thin-film transistor (TFT), a second TFT, a third TFT, a fourth TFT, a capacitor, and an organic light-emitting diode (OLED). A gate of the first TFT is electrically connected to a first node, a source of the first TFT electrically connected to a second node, and a drain of the first TFT electrically connected to a power signal. A gate of the second TFT is electrically connected to a scanning signal, a source of the second TFT is electrically connected to a first reference voltage signal, and a drain of the second TFT is electrically connected to the first node. A gate of the third TFT is electrically connected to the scanning signal. A source of the third TFT is electrically connected to a drain of the fourth TFT. A drain of the third TFT is electrically connected to the second node. A gate of the fourth TFT is electrically connected to a data signal, and a source of the fourth is electrically connected to a second reference voltage signal. One terminal of the capacitor is electrically connected to the first node. The other terminal of the capacitor is electrically connected to the second node. An anode of the OLED is electrically connected to the second node. A cathode of the OLED is electrically connected to a ground terminal. The first reference voltage signal is the power signal. A voltage across a gate and a source of the first TFT satisfies the following equation:

$$V_{gs} = \left[ \left(\frac{W}{L}\right)_{T4} / \left(\frac{W}{L}\right)_{T1} \right]^{\frac{1}{2}} (VDATA1 - Vb - Vth3) + Vth1;$$

where Vgs indicates the voltage across a gate and a source of the first TFT; Vb indicates a second reference voltage provided by the second reference voltage signal;

$$\left(\frac{W}{L}\right)_{T4}$$

indicates the ratio of the width to the length of a channel of the fourth TFT;

$$\left(\frac{W}{L}\right)_{T1}$$

indicates the ratio of the width to the length of a channel of the first TFT; VDATA1 is a display data signal at high voltage level provided by the data signal; Vth3 is a threshold voltage imposed on the third TFT; Vth1 is the threshold voltage imposed on the first TFT.

According to a second aspect of the present disclosure, a pixel driving circuit includes a first thin-film transistor (TFT), a second TFT, a third TFT, a fourth TFT, a capacitor, and an organic light-emitting diode (OLED). A gate of the first TFT is electrically connected to a first node, a source of the first TFT electrically connected to a second node, and a drain of the first TFT electrically connected to a power signal. A gate of the second TFT is electrically connected to a scanning signal, a source of the second TFT is electrically connected to a first reference voltage signal, and a drain of the second TFT is electrically connected to the first node. A gate of the third TFT is electrically connected to the scanning signal. A source of the third TFT is electrically connected to a drain of the fourth TFT. A drain of the third TFT is electrically connected to the second node. A gate of the fourth TFT is electrically connected to a data signal, and a source of the fourth is electrically connected to a second reference voltage signal. One terminal of the capacitor is electrically connected to the first node. The other terminal of the capacitor is electrically connected to the second node. An anode of the OLED is electrically connected to the second node. A cathode of the OLED is electrically connected to a ground terminal.

According to a third aspect of the present disclosure, an organic light-emitting diode (OLED) display includes a pixel driving circuit. The pixel driving circuit includes a first thin-film transistor (TFT), a second TFT, a third TFT, a fourth TFT, a capacitor, and an organic light-emitting diode (OLED). A gate of the first TFT is electrically connected to a first node, a source of the first TFT electrically connected to a second node, and a drain of the first TFT electrically connected to a power signal. A gate of the second TFT is electrically connected to a scanning signal, a source of the second TFT is electrically connected to a first reference voltage signal, and a drain of the second TFT is electrically connected to the first node. A gate of the third TFT is electrically connected to the scanning signal. A source of the third TFT is electrically connected to a drain of the fourth TFT. A drain of the third TFT is electrically connected to the second node. A gate of the fourth TFT is electrically connected to a data signal, and a source of the fourth is electrically connected to a second reference voltage signal. One terminal of the capacitor is electrically connected to the first node. The other terminal of the capacitor is electrically connected to the second node. An anode of the OLED is electrically connected to the second node. A cathode of the OLED is electrically connected to a ground terminal.

The present disclosure can bring beneficiary effects as describes: The fourth TFT is introduced in pixel driving circuit and the OLED display device to control the electric current of the first TFT with the data signal and the second reference signal during the compensation stage of threshold voltage. Further, the compensation voltage of the first TFT (i.e., a driving TFT) is compensated. Because of the introduction of the third TFT, the voltage level of a gate of the first TFT prevents from being affected by the second reference voltage sign during the lighting stage.

DETAILED DESCRIPTION OF THE EMBODIMENTS

Figure 1:
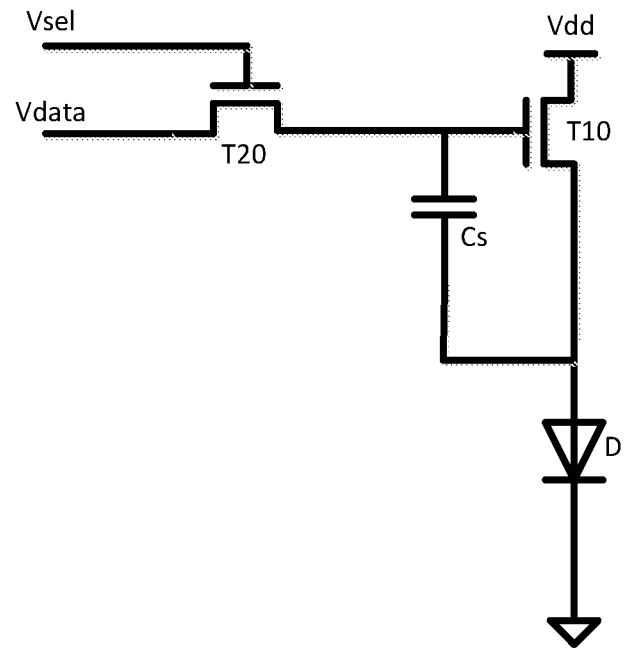
FIG. 1 is a circuit diagram of a conventional 2T1C pixel driving circuit.
Figure 2:
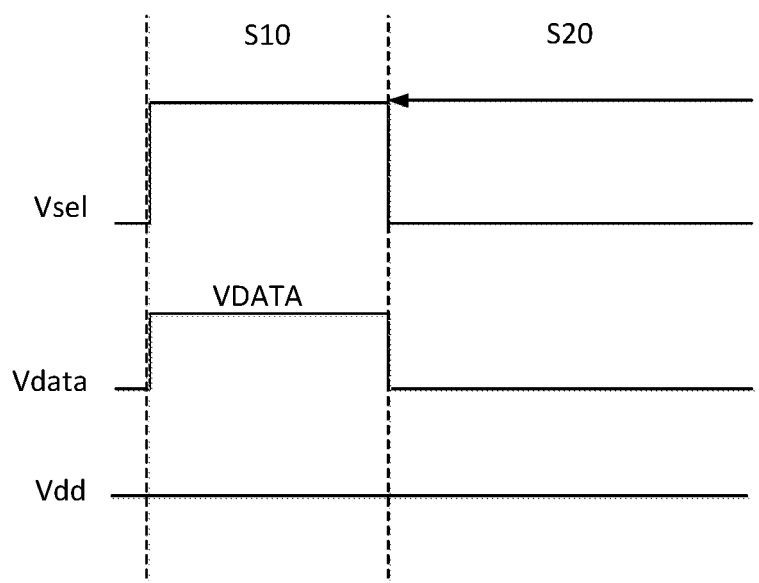
FIG. 2 illustrates a timing diagram of a 2T1C pixel driving circuit as illustrated in FIG. 1.

The invention is described below in detail with reference to the accompanying drawings, wherein like reference numerals are used to identify like elements illustrated in one or more of the figures thereof, and in which exemplary embodiments of the invention are shown. This invention may, however, be embodied in many different forms and should not be construed as limited to the particular embodiments set forth herein. Rather, these embodiments are provided so that this disclosure will be thorough and complete, and will fully convey the scope of the invention to those skilled in the art. The drawings illustrate embodiments of the invention and, together with the description, serve to explain the principles of the invention.

Figure 3:
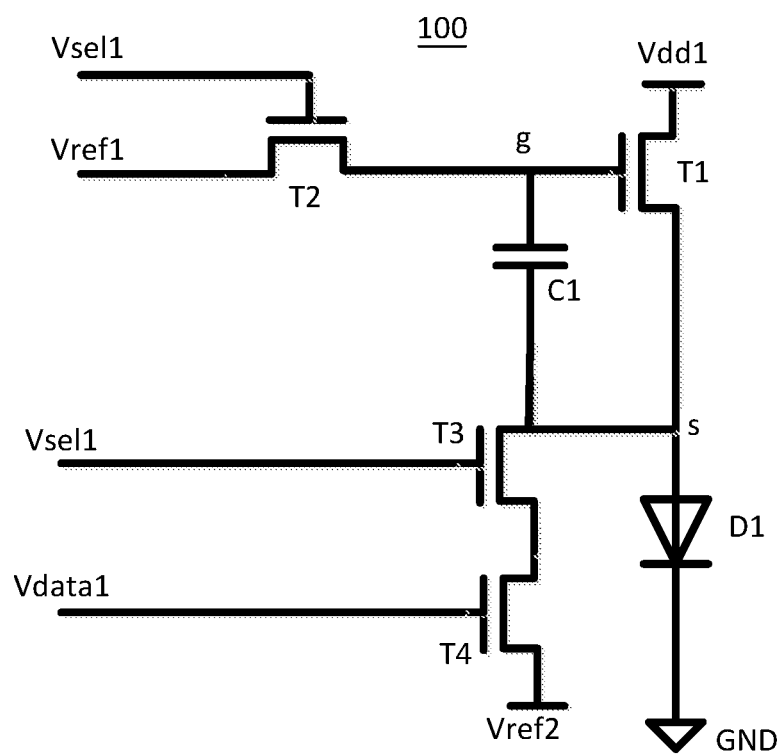
FIG. 3 is a circuit diagram of a pixel driving circuit according to a first embodiment of the present disclosure.

FIG. 3 is a circuit diagram of a pixel driving circuit according to a first embodiment of the present disclosure. The pixel driving circuit 100 includes a first thin-film transistor (TFT) T1, a second TFT T2, a third TFT T3, a fourth TFT T4, a capacitor C1, and an organic light-emitting diode (OLED) D1. The first TFT T1 is a driving TFT. The second TFT T2 and the third TFT T3 both are switch TFTs. The capacitor C1 is a storage capacitor.

A gate of the first TFT T1 is electrically connected to the first node g. A source of the first TFT T1 is electrically connected to the second node s. A drain of the first TFT T1 is electrically connected to a power signal Vdd1. A gate of the second TFT T2 is electrically connected to a scanning signal Vsel1. A source of the second TFT T2 is electrically connected to a first reference voltage signal Vref1. A drain of the second TFT T2 is electrically connected to the first node g. A gate of the third TFT T3 is electrically connected to the scanning signal Vsel1. A source of the third TFT T3 is electrically connected to a drain of the fourth TFT T4. A drain of the third TFT T3 is electrically connected to the second node s. A gate of the fourth TFT T4 is electrically connected to the data signal Vdata1. A source of the fourth TFT T4 is electrically connected to a second reference voltage signal Vref2. One terminal of the capacitor C1 is electrically connected to the first node g. The other terminal of the capacitor C1 is electrically connected to the second node s. An anode of the OLED D1 is electrically connected to the second node s. A cathode of the OLED D1 is electrically connected to a ground terminal GND.

In another embodiment, a thin-film transistor (TFT) T1, a second TFT T2, a third TFT T3, and a fourth TFT T4 all are low temperature poly-silicon (LTPS) TFTs, oxide semiconductor TFTs, or amorphous silicon (α-Si) TFTs.

Figure 4:
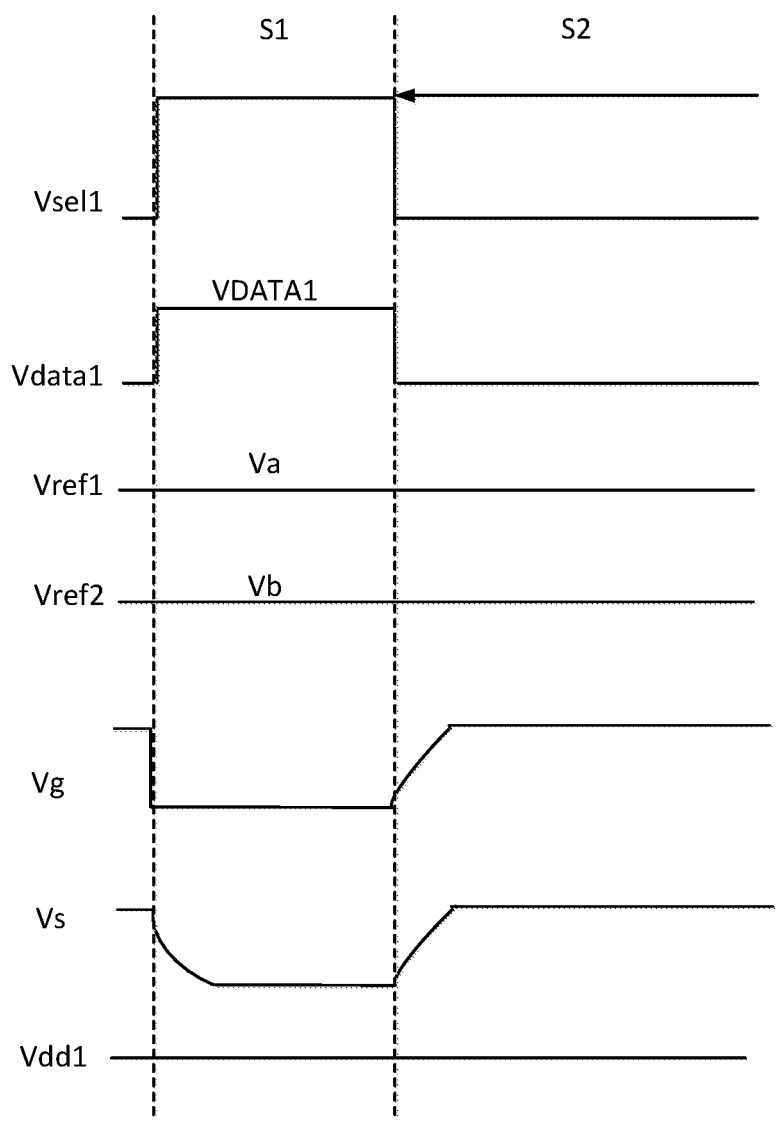
FIG. 4 illustrates a timing diagram of the pixel driving circuit as illustrated in FIG. 3.

FIG. 4 illustrates a timing diagram of the pixel driving circuit 100 as illustrated in FIG. 3. As FIG. 4 illustrates, the working process of the pixel driving circuit 100 are divided into a compensation stage of threshold voltage Si and a lighting stage S2.

The first reference voltage signal Vref1 and the second reference voltage signal Vref2 both are constant low voltage in the working process of the pixel driving circuit 100. The first reference voltage signal Vref1 is configured to provide a first reference voltage Va. The second reference voltage signal Vref2 is configured to provide a second reference voltage Vb. A power signal Vdd1 is constant high voltage. The data signal Vdata1 and the scanning signal Vsel1 correspond to the compensation stage of threshold voltage Si and the lighting stage S2 successively.

In another embodiment, a data signal Vdata1 and a scanning signal Vsel1 both are generated through an external timing controller. A first reference voltage signal Vref1, a second reference voltage signal Vref2, a power signal Vdd1 all are generated through a constant voltage source.

The data signal Vdata1 is a display data signal VDATA1 at high voltage level, and the scanning signal Vsel1 is at high voltage level during the compensation stage of threshold voltage S1 so that the first TFT T1, the second TFT T2, the third TFT T3, and the fourth TFT T4 all are turned on. The data signal Vdata1 writes the display data signal VDATA1 at high voltage level into the source of the first TFT T1 through the third TFT T3 and the fourth TFT T4. The first reference voltage Va provided by the first reference voltage signal Vref1 is written into the gate of the first TFT T1 through the second TFT T2.

That is, during the compensation stage of threshold voltage S1, equations are as follows:

$$V_g = V_a; \quad (1)$$

$$V_s = V_a - \left[\left(\frac{W}{L}\right)_{T4} / \left(\frac{W}{L}\right)_{T1}\right]^{\frac{1}{2}} (VDATA1 - Vb - Vth3) - Vth1;$$

$$V_{gs} = V_g - V_S = \left[\left(\frac{W}{L}\right)_{T4} / \left(\frac{W}{L}\right)_{T1}\right]^{\frac{1}{2}} (VDATA1 - Vb - Vth3) + Vth1.$$

where Vg indicates the voltage level of the first node g (i.e., the voltage level of the gate of the first TFT T1); Vs indicates the voltage level of the second node s (i.e., the voltage level of the source of the first TFT T1); Vgs indicates the voltage across a gate and a source of the first TFT T1; Va indicates a first reference voltage, and Vb indicates a second reference voltage;

$$\left(\frac{W}{L}\right)_{T4}$$

indicates the ratio of the width to the length of a channel of the fourth TFT T4;

$$\left(\frac{W}{L}\right)_{T1}$$

indicates the ratio of the width to the length of a channel of the first TFT T1; VDATA1 is a data signal at high voltage level; Vth3 is a threshold voltage imposed on the third TFT T3; Vth1 is the threshold voltage imposed on the first TFT T1.

The data signal Vdata1 is at low voltage level, and the scanning signal Vsel1 is at low voltage level during the lighting stage S2 so that the first TFT T1 and the fourth TFT T4 are turned on, and the second TFT T2 and the third TFT T3 are disconnected. The gate-source voltage $V_{gs}$ imposed on the first TFT T1 remains stable under the function of storage of the capacitor C1.

The gate-source voltage $V_{gs}$ for driving the OLED D1 to light includes a threshold voltage imposed on the first TFT T10. The electric current flowing through the OLED D1 and the square of the difference of the gate-source voltage $V_{gs}$ and the threshold voltage imposed on the first TFT T10 are in direct proportion. Therefore, the electric current flowing through the OLED D1 is irrelevant to the threshold voltage imposed on the first TFT T10, that is, the driving TFT. In other words, the threshold voltage is compensated.

At the compensation stage of threshold voltage Si in the present embodiment, the gate of the fourth TFT T4 is controlled by the data signal at high voltage level VDATA1, and the source is controlled by the second reference voltage Vb so the electric current flowing through the first TFT T10 is well controlled by the data signal at high voltage level VDATA1 and the second reference voltage Vb. At the lighting stage S2, the third TFT T3 can prevent the second reference voltage Vb from affecting the voltage level of the gate of the first TFT T10.

In the present embodiment, to ensure the first TFT T1 is turned on normally in the working process of the pixel driving circuit 100, the second reference voltage Vb needs to satisfy the following equation:

$$Vb < VDATA1 - Vth3° \quad (2)$$

In the present embodiment, to ensure the first TFT T1 is turned on normally during the compensation stage of threshold voltage S1, the first TFT T1 is turned on normally while the OLED D1 cannot be turned on. The first reference voltage Va satisfies the following equation:

$$\left[\left(\frac{W}{L}\right)_{T4} / \left(\frac{W}{L}\right)_{T1}\right]^{\frac{1}{2}} (VDATA1 - Vb - Vth3) - Vth1 + Voled1 > Va \quad (3)$$

and $$Va > \left[\left(\frac{W}{L}\right)_{T4} / \left(\frac{W}{L}\right)_{T1}\right]^{\frac{1}{2}} (VDATA1 - Vb - Vth3) - Vth1.$$

where Voled1 indicates voltage level of an anode node level of the OLED D1 during the compensation stage of threshold voltage.

Figure 5:
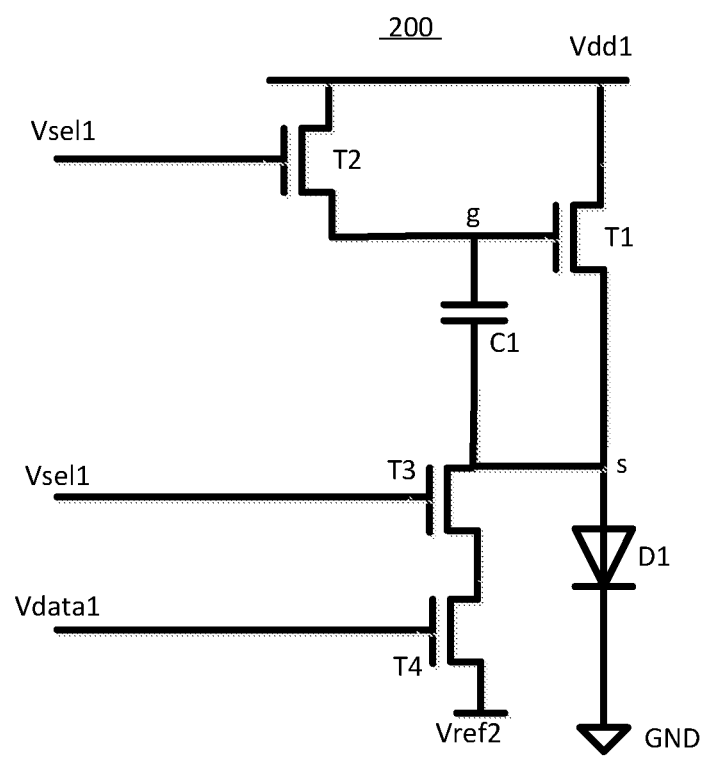
FIG. 5 is a circuit diagram of a pixel driving circuit according to a second embodiment of the present disclosure.

FIG. 5 is a circuit diagram of a pixel driving circuit 200 according to a second embodiment of the present disclosure. The difference between the pixel driving circuit 200 and the pixel driving circuit 100 as FIG. 3 illustrates is that a first reference voltage signal Vref1 is a power signal Vdd1 in the pixel driving circuit 200.

That is, no first reference signals Vref1 are in the pixel driving circuit 200. A source of the second TFT T2 is directly connected to the power signal Vdd1.

Figure 6:
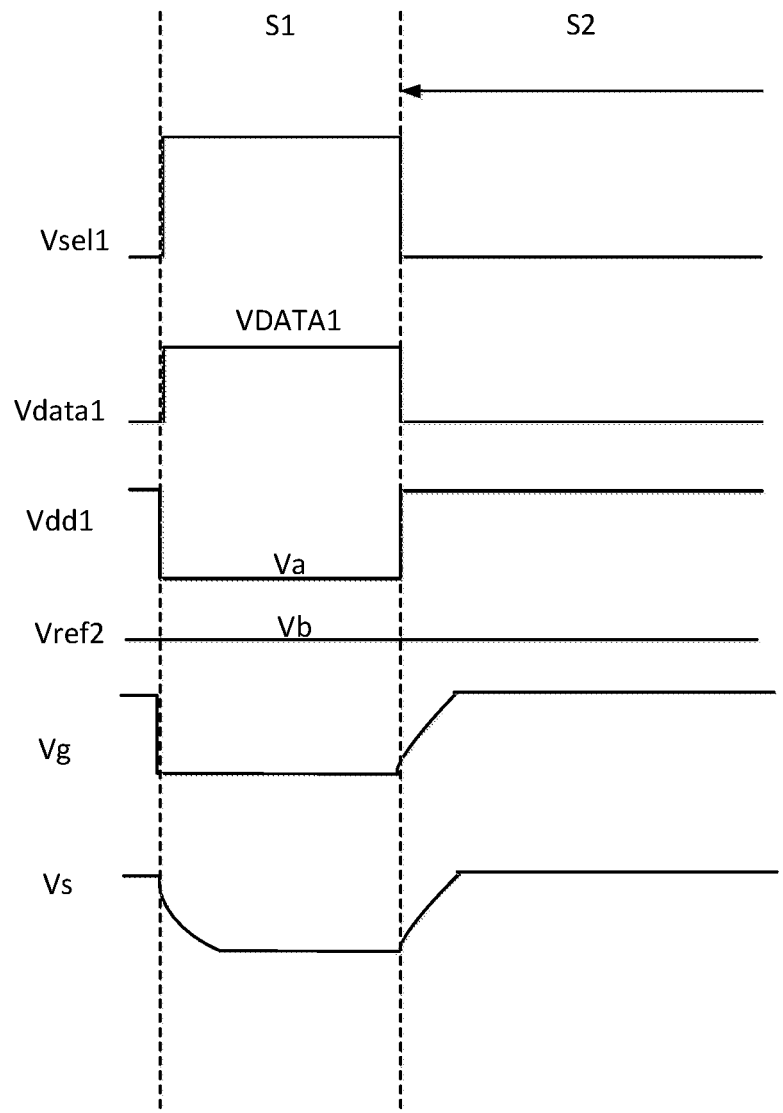
FIG. 6 illustrates a timing diagram of a pixel driving circuit as illustrated in FIG. 5.

Please refer to FIG. 6 as well. FIG. 6 illustrates a timing diagram of a pixel driving circuit 200 as illustrated in FIG. 5. The difference between the pixel driving circuit 200 and the pixel driving circuit 100 as FIG. 4 illustrates is the working process. In the pixel driving circuit 200 as FIG. 6 illustrates, the power signal Vdd1 is at referring low voltage level during the compensation stage of threshold voltage S1.

The referring low voltage level is a first reference voltage Va. The power signal Vdd1 is at high voltage level during the lighting stage S2.

The power signal Vdd1, the data signal Vdata1, and the scanning signal Vsel1 all are generated through an external timing controller in the present embodiment. A second reference voltage signal Vref2 is generated through a constant voltage source.

In the present embodiment, the voltage level of a gate of the first TFT T1, the voltage level of the source of the first TFT T1, and the gate-source voltage $V_{gs}$ satisfy the equation (1). The first reference voltage Va satisfies the equation (3). The second reference voltage Vb satisfies the equation (2).

Different from the first embodiment, the first reference voltage Va is the referring low voltage level of the power signal Vdd1 in the present embodiment.

Figure 7:
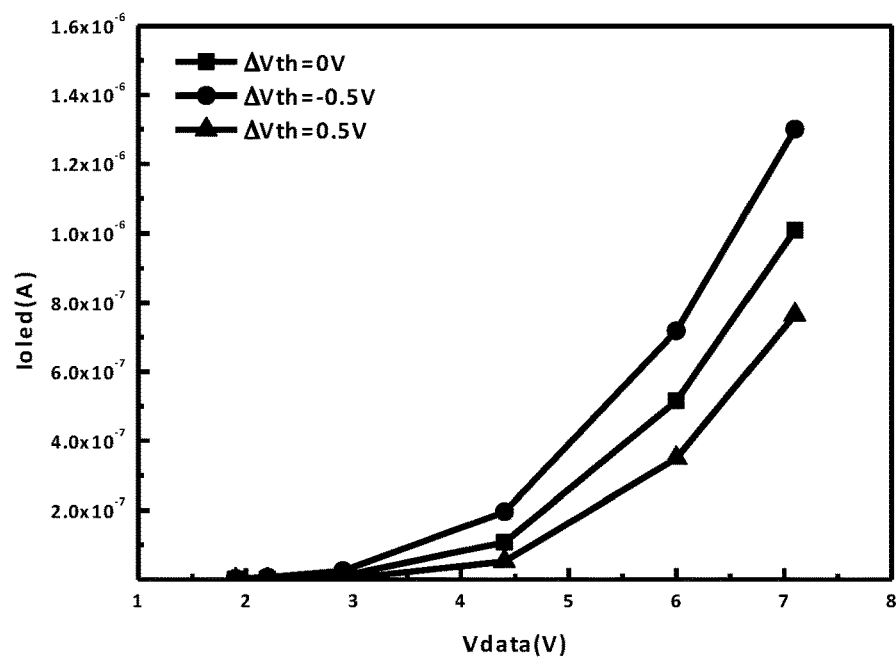
FIG. 7 illustrates a relationship of the electric current flowing through the OLED when a drift value of the threshold voltage of the conventional 2T1C driving TFT and a drift value of the threshold voltage of the first TFT.
Figure 8:
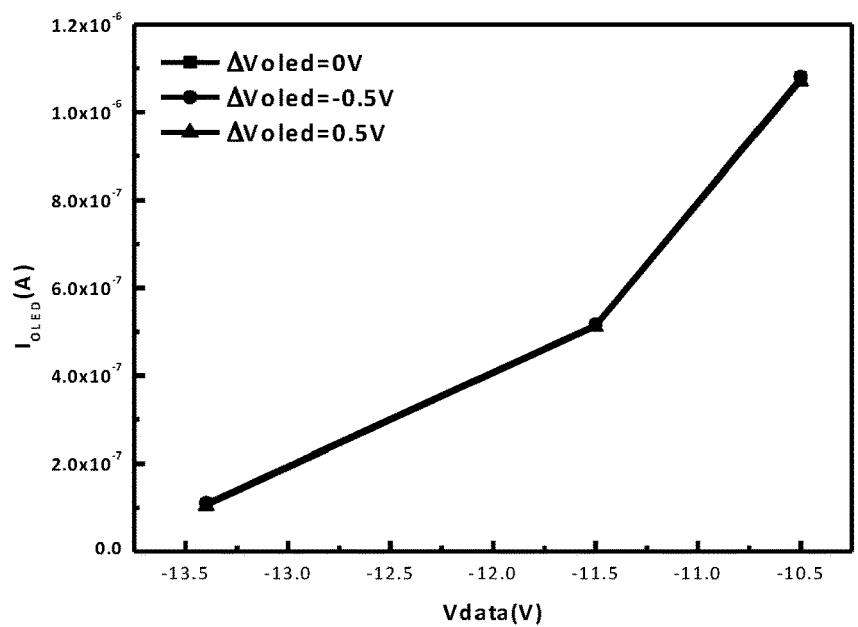
FIG. 8 illustrates a relationship of the electric current flowing through the OLED when a drift value of the threshold voltage of the driving TFT in the present disclosure and a drift value of the threshold voltage of the first TFT.

Please refer to FIG. 7 and FIG. 8. FIG. 7 illustrates a relationship of the electric current $I_{OLED}$ flowing through the OLED when a drift value ΔVth of the threshold voltage Vth of the conventional 2T1C driving TFT (i.e., the first TFT T10) and a drift value ΔVoled of the threshold voltage Vth1 of the first TFT T1 are 0 volts, +0.5V, and –0.5V. FIG. 8 illustrates a relationship of the electric current $I_{OLED}$ flowing through the OLED when a drift value ΔVth of the threshold voltage Vth of the driving TFT (i.e., the first TFT T10) 100 or 200 in the present disclosure and a drift value ΔVoled of the threshold voltage Vth1 of the first TFT T1 are 0 volts, +0.5V, and –0.5V. Compared FIG. 7 and FIG. 8, the variation of the electric current flowing through the OLED in the present disclosure is obviously less than the variation of the electric current flowing through the OLED in the 2T1C driving TFT without any compensation. Therefore, the threshold voltage of the driving TFT can be effectively compensated. Not only lighting stability of the OLED is ensured but also the display brightness of the OLED display panel keeps stable. The threshold voltage does not vary with use time, which means that the display quality is improved.

Figure 9:
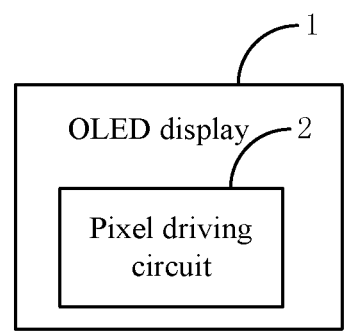
FIG. 9 is a schematic diagram of an organic light-emitting diode (OLED) display according to an embodiment of the present disclosure.

FIG. 9 is a schematic diagram of an organic light-emitting diode (OLED) display 1 according to an embodiment of the present disclosure. The OLED display 1 includes a pixel driving circuit 2. The pixel driving circuit 2 is the pixel driving circuit 100 or the pixel driving circuit 200.

The present disclosure can bring beneficiary effects as describes: The fourth TFT is introduced in the pixel driving circuit and the OLED display device to control the electric current of the first TFT with the data signal and the second reference signal during the compensation stage of threshold voltage. Further, the compensation voltage of the first TFT (i.e., a driving TFT) is compensated. Because of the introduction of the third TFT, the voltage level of a gate of the first TFT prevents from being affected by the second reference voltage sign during the lighting stage.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A pixel driving circuit, comprising: a first thin-film transistor (TFT), a second TFT, a third TFT, a fourth TFT, a capacitor, and an organic light-emitting diode (OLED);
    a gate of the first TFT electrically connected to a first node, a source of the first TFT electrically connected to a second node, a drain of the first TFT electrically connected to a power signal;
    a gate of the second TFT electrically connected to a scanning signal, a source of the second TFT electrically connected to a first reference voltage signal, a drain of the second TFT electrically connected to the first node;
    a gate of the third TFT electrically connected to the scanning signal; a source of the third TFT electrically connected to a drain of the fourth TFT; a drain of the third TFT is electrically connected to the second node;
    a gate of the fourth TFT electrically connected to a data signal, a source of the fourth electrically connected to a second reference voltage signal;
    one terminal of the capacitor electrically connected to the first node; the other terminal of the capacitor electrically connected to the second node;
    an anode of the OLED electrically connected to the second node; a cathode of the OLED electrically connected to a ground terminal;
    wherein the first reference voltage signal is the power signal,
    wherein a voltage across a gate and a source of the first TFT satisfies the following equation:

$$V_{gs} = \left[\left(\frac{W}{L}\right)_{T4} / \left(\frac{W}{L}\right)_{T1}\right]^{\frac{1}{2}} (VDATA1 - Vb - Vth3) + Vth1;$$

where Vgs indicates the voltage across a gate and a source of the first TFT; Vb indicates a second reference voltage provided by the second reference voltage signal;

$$\left(\frac{W}{L}\right)_{T4}$$

indicates the ratio of the width to the length of a channel of the fourth TFT;

$$\left(\frac{W}{L}\right)_{T1}$$

indicates the ratio of the width to the length of a channel of the first TFT; VDATA1 is a display data signal at high voltage level provided by the data signal; Vth3 is a threshold voltage imposed on the third TFT; Vth1 is the threshold voltage imposed on the first TFT.

2. The pixel driving circuit of claim 1, wherein the second reference voltage signal is constant low voltage; the power signal, the data signal, and the scanning signal correspond to a compensation stage of threshold voltage and a lighting stage;
    during the compensation stage of threshold voltage, the power signal is at referring low voltage level: the data signal is the display data signal at high voltage level; the scanning signal is at high voltage level;
    during the lighting stage, the power signal is at high voltage level; the data signal is at low voltage level; the scanning signal is at low voltage level.

3. A pixel driving circuit, comprising: a first thin-film transistor (TFT), a second TFT, a third TFT, a fourth TFT, a capacitor, and an organic light-emitting diode (OLED);

a gate of the first TFT electrically connected to a first node, a source of the first TFT electrically connected to a second node, a drain of the first TFT electrically connected to a power signal;

a gate of the second TFT electrically connected to a scanning signal, a source of the second TFT electrically connected to a first reference voltage signal, a drain of the second TFT electrically connected to the first node;

a gate of the third TFT electrically connected to the scanning signal; a source of the third TFT electrically connected to a drain of the fourth TFT; a drain of the third TFT is electrically connected to the second node;

a gate of the fourth TFT electrically connected to a data signal, a source of the fourth electrically connected to a second reference voltage signal;

one terminal of the capacitor electrically connected to the first node; the other terminal of the capacitor electrically connected to the second node;

an anode of the OLED electrically connected to the second node; a cathode of the OLED electrically connected to a ground terminal.

4. The pixel driving circuit of claim 3, wherein the first reference voltage signal is the power signal.

5. The pixel driving circuit of claim 4, wherein the second reference voltage signal is constant low voltage; the power signal, the data signal, and the scanning signal correspond to a compensation stage of threshold voltage and a lighting stage;

during the compensation stage of threshold voltage, the power signal is at referring low voltage level; the data signal is the display data signal at high voltage level; the scanning signal is at high voltage level;

during the lighting stage, the power signal is at high voltage level; the data signal is at low voltage level; the scanning signal is at low voltage level.

6. The pixel driving circuit of claim 5, wherein the power signal, the data signal, and the scanning signal all are generated through an external timing controller.

7. The pixel driving circuit of claim 3, wherein the first reference voltage signal and the second reference voltage signal both are constant low voltage; the power signal is constant high voltage; the data signal and the scanning signal correspond to a compensation stage of threshold voltage and a lighting stage successively;

the data signal is a display data signal at high voltage level, and the scanning signal Vsel 1 is at high voltage level during the compensation stage of threshold voltage;

the data signal is at low voltage level; the scanning signal is at low voltage level during the lighting stage.

8. The pixel driving circuit of claim 7, wherein the data signal and the scanning signal both are generated through an external timing controller.

9. The pixel driving circuit of claim 3, wherein a voltage across a gate and a source of the first TFT satisfies the following equation:

$$V_{gs} = \left[\left(\frac{W}{L}\right)_{T4} \bigg/ \left(\frac{W}{L}\right)_{T1}\right]^{\frac{1}{2}} (VDATA1 - Vb - Vth3) + Vth1;$$

where Vgs indicates the voltage across a gate and a source of the first TFT; Vb indicates a second reference voltage provided by the second reference voltage signal;

$$\left(\frac{W}{L}\right)_{T4}$$

indicates the ratio of the width to the length of a channel of the fourth TFT;

$$\left(\frac{W}{L}\right)_{T1}$$

indicates the ratio of the width to the length of a channel of the first TFT; VDATA1 is a display data signal at high voltage level provided by the data signal; Vth3 is a threshold voltage imposed on the third TFT; Vth1 is the threshold voltage imposed on the first TFT.

10. The pixel driving circuit of claim 3, wherein the second reference voltage Vb provided by the second reference signal needs to satisfy the following equation:

$$Vb < VDATA1 - Vth3;$$

where a display data signal at high voltage level provided by the data signal is a threshold voltage of the third TFT.

11. The pixel driving circuit of claim 3, wherein the TFT, the second TFT, the third TFT, and the fourth TFT all are low temperature poly-silicon (LTPS) TFTs, oxide semiconductor TFTs, or amorphous silicon (α-Si) TFTs.

* * * * *